(12) United States Patent
Tang et al.

(10) Patent No.: US 8,030,983 B2
(45) Date of Patent: Oct. 4, 2011

(54) COMMON MODE TRACKING RECEIVER

(75) Inventors: Xinghai Tang, Cedar Park, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/484,425

(22) Filed: Jun. 15, 2009

(65) Prior Publication Data

US 2010/0316167 A1  Dec. 16, 2010

(51) Int. Cl.
 *H03K 3/00* (2006.01)
(52) U.S. Cl. .......... 327/291; 327/299; 361/56; 361/91.1
(58) Field of Classification Search ............... 361/56, 361/57, 91.1, 91.5, 91.7
See application file for complete search history.

(56) References Cited

U.S. PATENT DOCUMENTS

| | | |
|---|---|---|
| 4,504,747 A | 3/1985 | Smith et al. |
| 5,568,561 A | 10/1996 | Whitlock |
| 6,066,972 A | 5/2000 | Strom |
| 6,147,540 A | 11/2000 | Coddington |
| 6,351,171 B1 * | 2/2002 | Balhiser ................. 327/318 |
| 6,763,486 B2 | 7/2004 | Lai et al. |
| 6,861,680 B2 * | 3/2005 | Ker et al. ............... 257/199 |
| 6,985,340 B2 * | 1/2006 | Nojiri et al. ............ 361/56 |
| 7,057,425 B2 * | 6/2006 | Balhiser et al. ........ 327/108 |
| 2002/0163768 A1 * | 11/2002 | Kwon et al. ............ 361/56 |
| 2004/0086061 A1 | 5/2004 | Lundberg |

\* cited by examiner

*Primary Examiner* — An T Luu

(57) ABSTRACT

A clock receiver (301) on an integrated circuit (202) includes a programmable AC voltage divider (502) for receiving, through an input capacitor (406), a clock signal (206) from a clock generator (204) off the integrated circuit and for outputting a modified signal that has a reduced voltage swing, an inverter (440) coupled to the programmable voltage divider, and a common mode setting circuit (506), coupled to an input and an output of the inverter. The common mode setting circuit sets and maintains a common mode at the input of the inverter in response to a voltage at the input of the inverter and a voltage at the output of the inverter. The strength of transistors in the common mode tracking circuit tracks the strength of transistors in the inverter such that the common mode at the input to the inverter tracks a trip point of the inverter.

20 Claims, 6 Drawing Sheets

COMMON MODE TRACKING RECEIVER

BACKGROUND OF THE INVENTION

1. Field of the Invention

This invention relates generally to clock receivers, and more specifically to an AC-coupled clock receiver for receiving a single-ended clock signal.

2. Related Art

FIG. 1 is a schematic diagram of a prior art clock receiver 101. An external reference clock generator provides a clock signal to an external clock input node 102. There is a capacitor 106 between the external clock input node 102 and a first node 103 of the clock receiver 101 for coupling alternating current ("AC") of the clock signal to the first node 103. The clock signal is a single-ended clock signal and may be one of several voltages higher than the operating voltage of the clock receiver 101. A phase-locked loop control logic supplies a 3-bit receiver select signal 107 to a receiver select input node 104. The clock receiver 101 comprises a first programmable transistor 111, a second programmable transistor 112, and a third programmable transistor 113. The programmable transistors are NMOS transistors. The source of each programmable transistor is coupled to ground, and the gate of each programmable transistor is coupled to a 1-bit receiver select line 115, 116 and 117 that is coupled to the receiver select input node 104 through a buffer 105. The clock receiver 101 comprises a first protection capacitor 121, a second protection capacitor 122, and a third protection capacitor 123. Each protection capacitor is coupled between the first node 103 and the drain of the first programmable transistor 111, the second programmable transistor 112, and the third programmable transistor 113, respectively. One embodiment of the prior art clock receiver 101 also comprises a first diode 131 coupled between the first node 103 and $V_{DD}$, and a second diode 132 coupled between the first node and ground. The diodes 131 and 132 may perform a clamping operation during power-up. The clock receiver 101 further comprises an inverter 140 that has an input coupled to the first node 103 and an output coupled to an output buffer 150. The output buffer 150 is coupled to an output node 151. The inverter 140 comprises a PMOS transistor 141 and a NMOS transistor 142.

The clock receiver 101 includes a first state-dependent resistive transistor 161 having a drain coupled to the first node 103, a gate coupled to the output of the inverter 140 and a source coupled to $V_{DD}$. The first state-dependent resistive transistor 161 is a PMOS transistor. The clock receiver 101 also includes a second state-dependent resistive transistor 162 having a drain coupled to the first node 103, a gate coupled to the output of the inverter 140 and a source coupled to ground. The second state-dependent resistive transistor 162 is a NMOS transistor. The purpose of the state-dependent resistive transistors 161 and 162 is to drive the input of the inverter all the way to ground or all the way to $V_{DD}$. When the signal at the output of the inverter goes from high to low, the first state-dependent resistive transistor turns on, and causes the DC signal at the input to the inverter to be at $V_{DD}$. When the signal at the output of the inverter goes from low to high, the second state-dependent resistive transistor turns on, and causes the DC signal at the input to the inverter to be at ground.

The input capacitor 106 and the protection capacitors 121, 122 and 123 form a programmable AC voltage divider that divides the clock signal into an appropriate voltage swing so that the gates of inverter transistors 141 and 142, and the gates of the state-dependent resistive transistors 161 and 162, in regular $V_{DD}$ domain, can receive the clock signal without breaking a reliability requirement. The receiver select signal 107 is set to an appropriate value to determine a correct divider ratio of the programmable AC voltage divider. The value of the receiver select signal 107 depends on the voltage of the clock signal provided by the external reference clock generator. The receiver select signal 107 selectively applies a voltage to the gate of one or more of the programmable transistors 111, 112 and 113 via 1-bit receiver select lines 115, 116 and 117.

If the operating voltage of the clock receiver 101 is 1V, the threshold, or trip point, of the inverter 140 is generally 0.5V, or $V_{DD}/2$. The external reference clock generator provides a 3.3V single-ended clock signal, which means that the clock signal varies between 3.3V and 0V. When the external reference clock generator provides a 3.3V clock signal, the PLL control logic provides a receiver select signal 107 whose value causes the AC voltage divider of the clock receiver 101 to divide the 3.3V clock signal from the external reference clock generator by approximately three (3), thereby producing a signal that varies between approximately 1V and 0V at the first node 103. However, if, for any reason, the clock signal is degraded externally to the clock receiver 101, for example, from 3.3V to 1V then, after the 1V signal is divided by approximately three (3) by the AC voltage divider of the clock receiver 101, a signal that varies between approximately 0.3V and 0V is produced at the first node 103. However, the inverter 140 is expecting 1V peak-to-peak signal. Therefore, the 0.3V signal is not enough to reach the threshold, or trip point, of the inverter 140. Furthermore, the state-dependent resistive transistors 161 and 162 drive the signal at the input to the inverter 140 to either 1V DC or to 0V DC. Therefore, when the 0.3V peak-to-peak alternating voltage signal resulting from the received, divided clock signal is combined with 1.0V DC, the closest the voltage at the input to the inverter 140 can come to the trip point is 1.0V−0.3V=0.7V. And, therefore, when the 0.3V peak-to-peak alternating voltage signal resulting from the received, divided clock signal is combined with 0V DC, the closest the voltage at the input to the inverter 140 can come to the trip point is 0V+0.3V=0.3V. In neither case, does the voltage at the input to the inverter 140 reach the 0.5V threshold of the inverter; therefore, the inverter fails to work. Consequently, the receiver 101 fails to work.

Another way of describing the foregoing disadvantage of the prior art clock receiver 101 is as follows. In theory, the clock receiver 101 will fail when a voltage input high of a nominal 3.3V clock signal from a 3.3V domain external reference clock generator degrades below 1.5V. In practice, the clock receiver 101 will likely fail before the voltage degradation of the nominal 3.3V clock signal from the 3.3V domain external reference clock generator reaches 1.65V.

The clock receiver 101 may receive a clock signal from multiple voltage domains and the clock signal may be on before all power domains are stable. If the clock receiver 101 is receiving the clock signal from a higher voltage domain than that of the clock receiver 101, and if the clock receiver has not finished powering-up, the clock receiver can be damaged. Within a voltage domain, a voltage swing variation of the clock signal and/or a variation of the trip point of the inverter 140 can distort the duty cycle of the received clock signal, and may permanently damage of the clock receiver 101. Some other known prior art receivers use a pair of diode-connected PMOS transistors by itself, or a pair of diode-connected NMOS transistors by itself; in either case, such a pair always sets the common mode to $V_{DD}/2$. However, these other known prior art receivers do not fully compensate for voltage swing variations within a voltage domain.

The "common mode" of a signal, such as the clock signal, refers to a DC voltage level of the signal, or may refer to an average between a voltage input high (VIH) and a voltage input low (VIL) of the signal. In the prior art receiver 101 of FIG. 1, the common mode of the signal at the input of the inverter 140 does not track the trip point of the inverter.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF EXEMPLARY EMBODIMENTS

Figure 1:
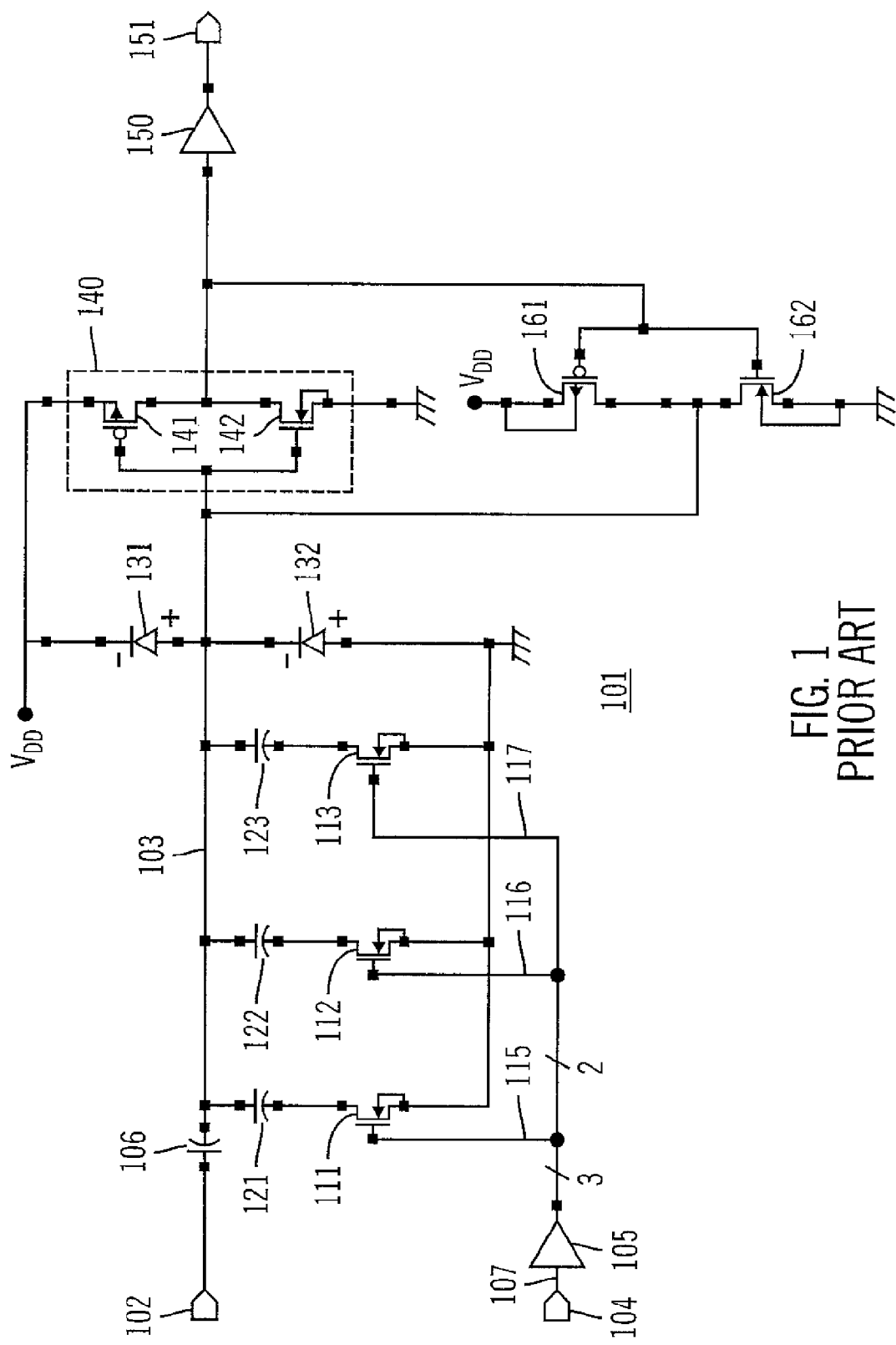
FIG. 1 is a schematic diagram of a prior art clock receiver.
Figure 2:
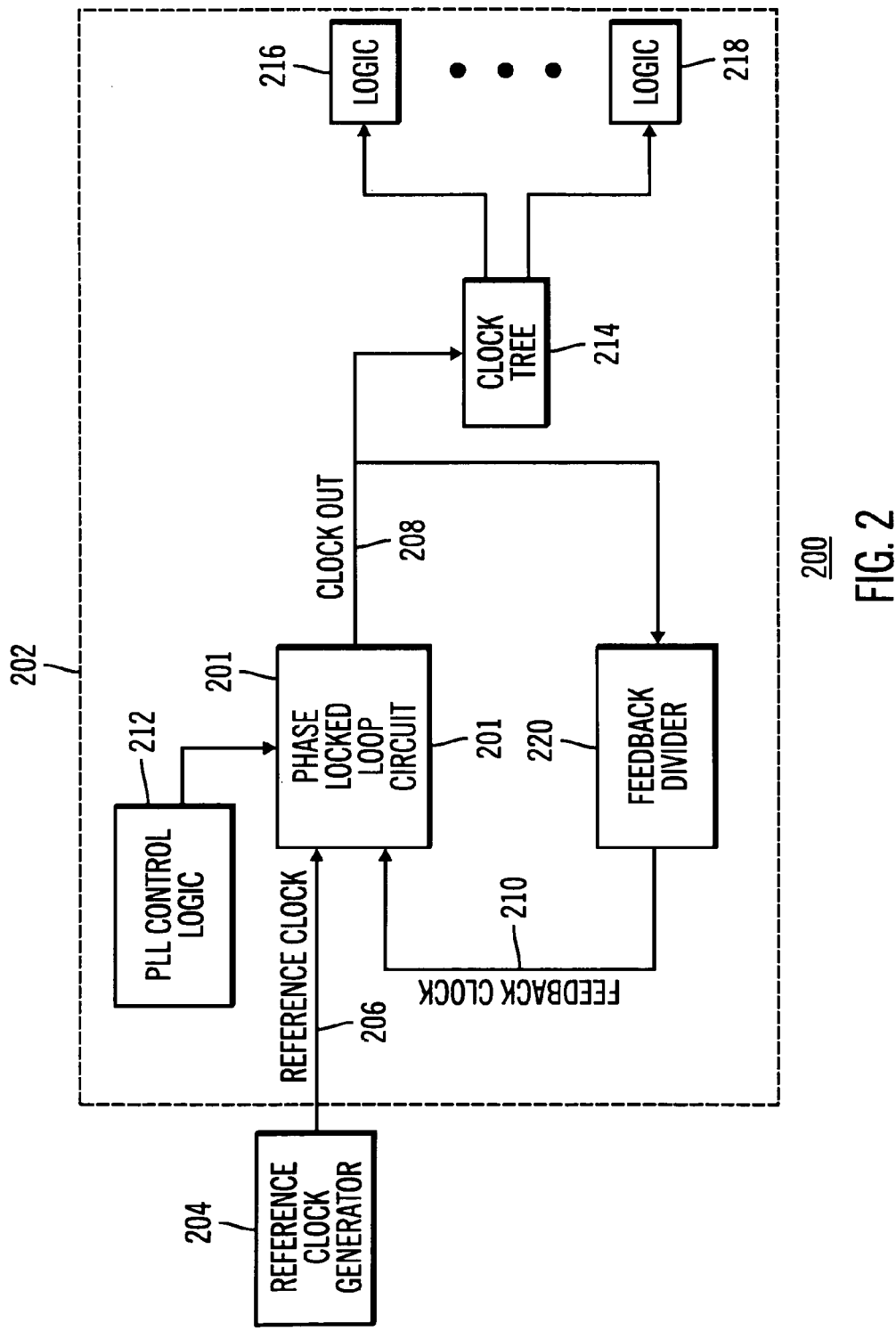
FIG. 2 is a simplified functional block diagram of a clock generation and distribution network including a phase-locked loop circuit on an integrated circuit, and a reference clock generator external to the integrated circuit.

FIG. 2 is a simplified functional block diagram of a clock generation and distribution network 200. The functional blocks of the clock generation and distribution network 200 reside on an integrated circuit 202, except for a reference clock generator 204 that resides off the integrated circuit, although it may reside on another integrated circuit. The integrated circuit operates in a first voltage domain, such as 1V. The reference clock generator 204 operates in a second voltage domain that is higher than the first voltage domain. Examples of the second, higher voltage domain are 1.8V, 2.5V and 3.3V. The reference clock generator 204 outputs a reference clock signal 206. In one embodiment, the external reference clock generator 204 provides a single-ended 3.3V clock signal 206 that varies between 3.3V and 0V (see waveform 601 in FIG. 6). In one embodiment, the reference clock signal is between 33 MHz and 200 MHz, but may be at other frequencies in other embodiments. The purpose of the clock generation and distribution network 200 is to receive the reference clock signal 206 from the reference clock generator 204, and to supply a reliable clock signal to any circuit of the integrated circuit 202 that uses a clock signal. The clock generation and distribution network 200 comprises a PLL circuit 201 that generates a clock out signal 208 based on the reference clock signal 206 and a feedback clock signal 210. The clock generation and distribution network 200 includes a PLL control logic 212 coupled to the PLL circuit, and a clock tree 214. The clock out signal 208 is distributed, via the clock tree 214, to a plurality of logic circuits, including memory, such as logic 216 and 218. The clock signal goes through a feedback divider 220, and then is fed back to the PLL circuit 201. The feedback divider 220 includes a plurality of counters that divides the frequency of the clock out signal 208, which is typically at a higher frequency than the frequency of the reference clock signal 206. For example, if the reference clock signal is 50 MHz, the clock out signal is 500 MHz. Some embodiments may not include the feedback divider 220. The PLL circuit 201 compares the reference clock signal 206 and the feedback clock signal 210, and adjusts the clock out signal 208 accordingly.

Figure 3:
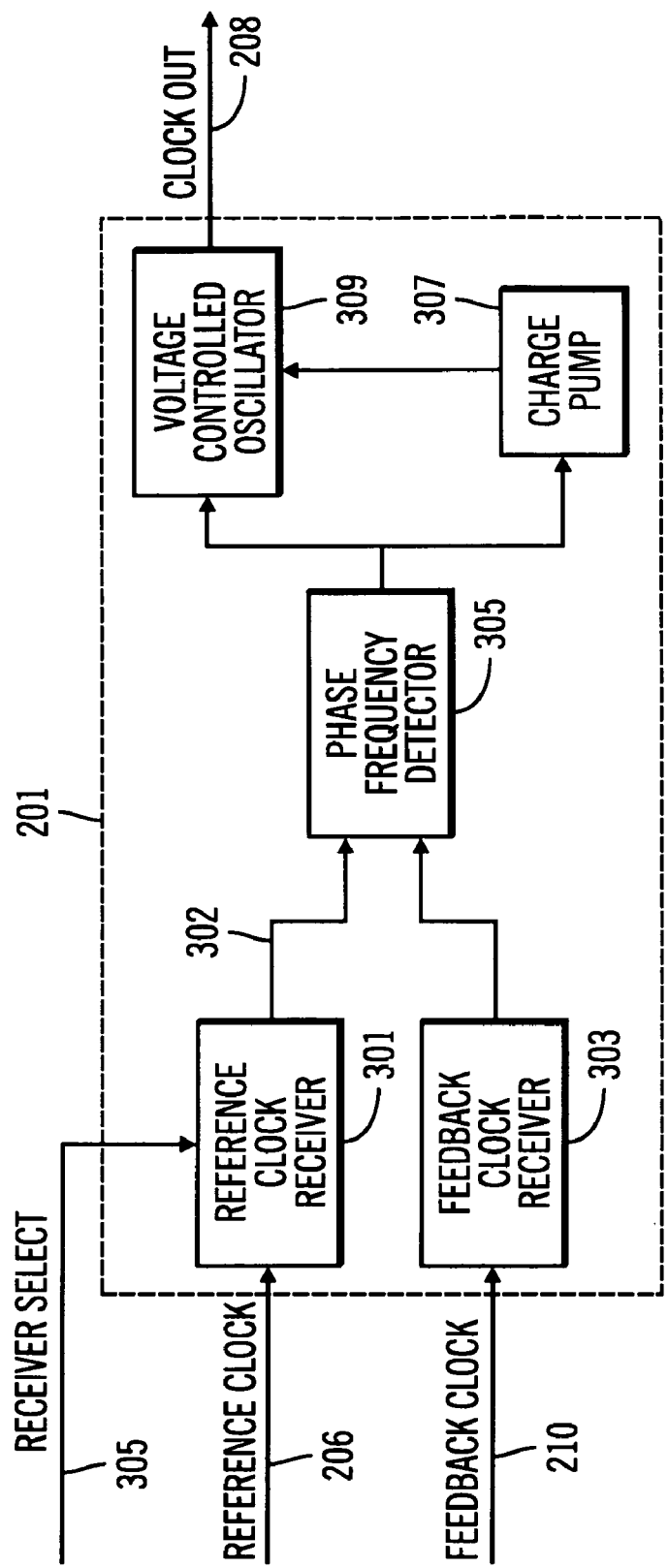
FIG. 3 is a simplified functional block diagram of the phase-locked loop circuit of FIG. 2, including a reference clock receiver.

FIG. 3 is a simplified functional block diagram of the PLL circuit 201. The PLL circuit 201 includes a reference clock receiver 301 and a feedback clock receiver 303. The reference clock receiver 301 receives the reference clock signal 206 from the reference clock generator 204. The reference clock receiver 301 also receives a receiver select signal 305 from the PLL control logic 212. The PLL circuit 201 includes a phase and frequency detector 305. An output signal 302 from the reference clock receiver 301 and an output signal 304 from the feedback clock receiver 303 are coupled to the phase and frequency detector 305. The phase and frequency detector 305 compares the reference clock signal 206 and the feedback clock signal 210. The phase and frequency detector 305 detects the relative positions of an edge of the reference clock signal 206 and a corresponding edge the feedback clock signal 210, thereby detecting a phase difference. The phase and frequency detector 305 also detects any difference in frequency between the reference clock signal 206 and the feedback clock signal 210. The PLL circuit 201 includes a charge pump 307 and a voltage-controlled oscillator 309, both coupled to an output of the phase and frequency detector 305. The charge pump 307 is a phase error controlled current source, and may include a capacitor coupled to the voltage-controlled oscillator 309. If the feedback clock signal 210 is leading the reference clock signal 206, the charge pump 307 becomes a current sink by taking charge out of the capacitor. If the feedback clock signal 210 is lagging the reference clock signal 206, the charge pump 307 becomes a current source by adding charge to the capacitor. The phase and frequency detector 305 adjusts the charge pump 307 and the voltage controlled oscillator 309 accordingly, until the reference clock signal 206 and the feedback clock signal 210 are lined up, i.e., have zero phase difference and are of equal frequency.

The reference clock receiver 301 and the feedback clock receiver 303 should have a same propagation delay. Therefore, if the feedback clock receiver 303 were identical to the reference clock receiver 301, their delays would be identical. However, because the input capacitor 406 of the reference clock receiver 301 is very large, the input capacitor does not delay the reference clock signal 206 significantly. Therefore, the input capacitor 406 can be removed from the feedback clock receiver 303, i.e., the input of the feedback clock receiver can be connected directly to the clock out signal 208 via the feedback divider 220, in which case, the reference clock receiver 301 and the feedback clock receiver 303 would still have approximately the same propagation delay. Also, the protection capacitors in the front end of the feedback clock receiver 303 do not have to be programmed. Alternatively, the front end of the feedback clock receiver 303 is not needed because the common mode of the clock out signal 208 is known.

Figure 4:
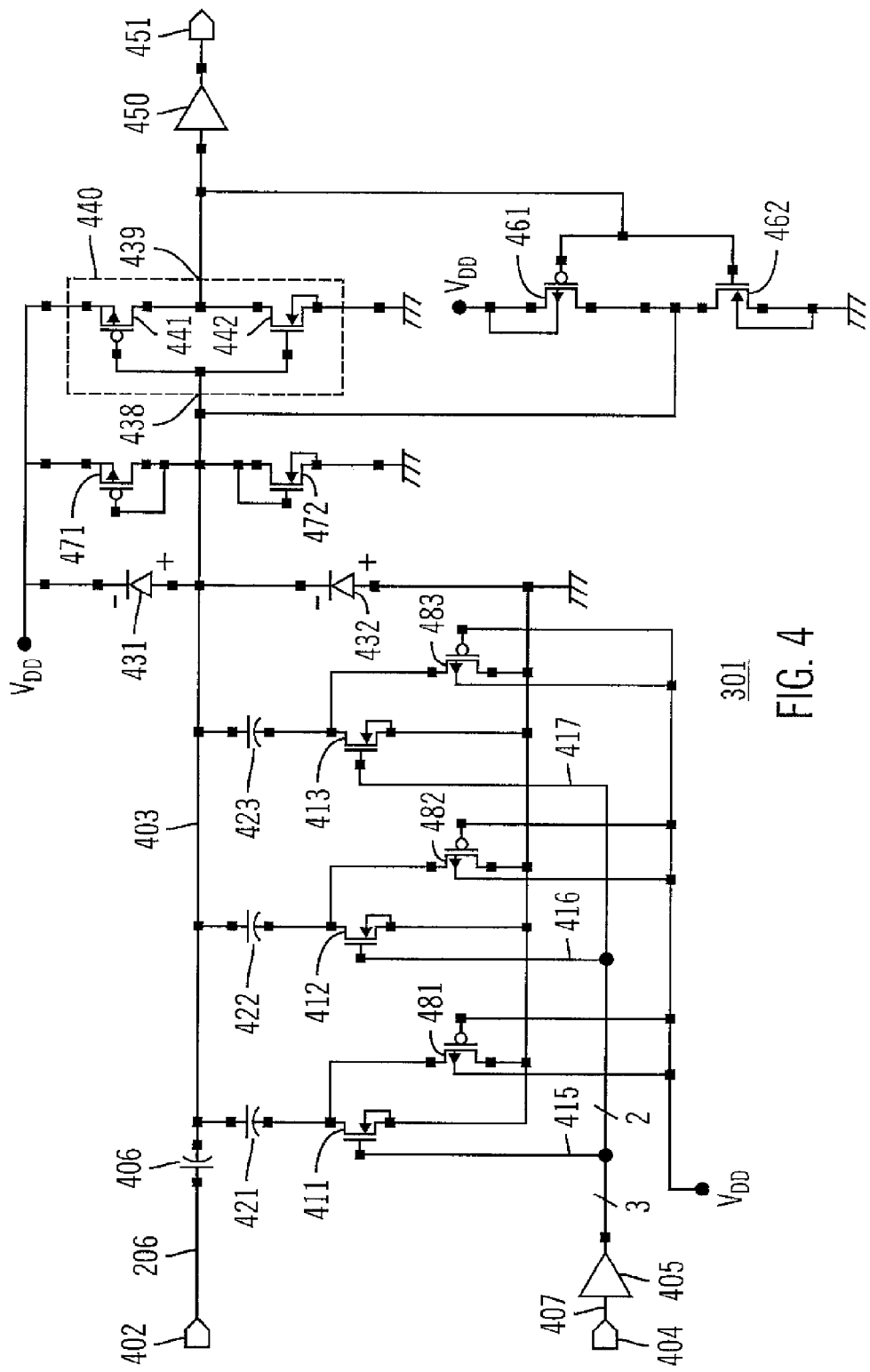
FIG. 4 is a schematic diagram of a reference clock receiver, such as the reference clock receiver shown in FIG. 3.

FIG. 4 is a schematic diagram of the reference clock receiver 301. The purpose of the reference clock receiver 301 is to supply a reliable clock signal to other circuits on the integrated circuit 202, and to be able to receive, during power-up of the reference clock receiver, the reference clock signal 206 from the reference clock generator 204 of higher voltage domain, without being damaged by the reference clock signal 206 that has a higher voltage.

The reference clock generator 204 provides the reference clock signal 206 to an external clock input node 402. There is a capacitor 406 between the external clock input node 402 and a first node 403 of the reference clock receiver 301 for AC-coupling the clock signal to the first node 403. The reference clock signal 206 is a single-ended clock signal and may be any one of several voltages higher than the operating voltage of the reference clock receiver 301. The PLL control logic 212 supplies a multiple-bit receiver select signal 407 to a receiver select input node 404. In one embodiment, the multiple-bit receiver select signal 407 is a 3-bit receiver select signal. The reference clock receiver 301 comprises a first programmable transistor 411, a second programmable transistor 412, and a third programmable transistor 413. The programmable transistors are NMOS transistors. The source of each of the programmable transistors is coupled to ground, and the gate of each of the programmable transistors is coupled to a 1-bit receiver select line 415, 416 and 417 that is coupled to the receiver select input node 404 through a buffer 405. The reference clock receiver 301 comprises a first protection capacitor 421, a second protection capacitor 422, and a third protection capacitor 423. Each protection capacitor is coupled between the first node 403 and the drain of the first programmable transistor 411, the second programmable transistor 412, and the third programmable transistor 413, respectively. The input capacitor 406 and the protection capacitors 421, 422 and 423 form a programmable AC voltage divider that divides the reference clock signal 206 into an appropriate voltage swing so that the gates of transistors of the reference clock receiver 301, can receive a modified signal (see waveform 602 in FIG. 6) without being damaged. The modified signal is representative of the reference clock signal 206 in that it has a same frequency as the reference clock signal. The receiver select signal 407 is set by the PLL control logic 212 to an appropriate value to determine a correct divider ratio of the programmable AC voltage divider. The value of the receiver select signal 407 depends on the voltage of the reference clock signal 206. The receiver select signal 407 selectively applies a positive voltage to the gate of one or more of the programmable transistors 411, 412 and 413 via 1-bit receiver select lines 415, 416 and 417, thereby selectively turning on one or more of the programmable transistors, and consequently thereby adding the capacitance of one or more of the protection capacitors 421, 422 and 423 to the programmable AC voltage divider. In one embodiment, the capacitance of the input capacitor 406 is approximately three times the capacitance of each one of the protection capacitors 421, 422 and 423. For example, when the reference clock receiver 301 is receiving a 3.3V peak-to-peak reference clock signal 206, only a selected one of the programmable transistors is on, thereby producing an approximately 1V peak-to-peak modified signal at the first node 403. For example, when the reference clock receiver 301 is receiving a 2.5V peak-to-peak reference clock signal 206, a selected two of the programmable transistors are on, thereby producing an approximately 1V peak-to-peak modified signal at the first node 403. In one embodiment, the capacitance of the protection capacitors 421, 422 and 423 are equal. In another embodiment, each of the protection capacitors 421, 422 and 423 has a different capacitance.

One embodiment of the reference clock receiver 301 also comprises a first diode 431 coupled between the first node 403 and a first supply potential, for example, $V_{DD}$, and a second diode 432 coupled between the first node and a second supply potential, for example, ground. The diodes 431 and 432 may perform a clamping operation during power-up. The diodes 431 and 432 start to conduct if the voltage at the first node 403 goes above $V_{DD}$ or below zero. The reference clock receiver 301 further comprises an inverter 440 that has an input 438 coupled to the first node 403 and an output 439 coupled to an output buffer 450. The inverter 440 comprises a first inverter transistor 441 and a second inverter transistor 442. The first inverter transistor 441 is a PMOS transistor and the second inverter transistor 442 is a NMOS transistor. The inverter 440 outputs a voltage signal representing the opposite logic level to the voltage at its input. The inverter 440 has a trip point, which is a voltage at the input of the inverter at which the output of the inverter changes from logic level "1", or $V_{DD}$, to logic level "0", or 0V, or vice versa. Ideally, the trip point of the inverter 440 is $V_{DD}/2$; however, the trip point varies with process, voltage and temperature. The output buffer 450 is coupled to an output node 451. The output buffer 450 cleans the voltage signal from the inverter 440 and sends the output signal 302 of the reference clock receiver 301 to other portion of the integrated circuit 202.

The reference clock receiver 301 includes a first state-dependent resistive transistor 461 having a drain coupled to the first node 403, a gate coupled to the output of the inverter 440 and a source coupled to $V_{DD}$. The first state-dependent resistive transistor 461 is a PMOS transistor. The reference clock receiver 301 also includes a second state-dependent resistive transistor 462 having a drain coupled to the first node 403, a gate coupled to the output of the inverter 440 and a source coupled to ground. The second state-dependent resistive transistor 462 is a NMOS transistor.

The reference clock receiver 301 includes first common mode setting transistor 471 having a gate and a drain coupled to the first node 403 and a source coupled to $V_{DD}$. Therefore, the first common mode setting transistor 471 is diode-connected. The first common mode setting transistor 471 is a PMOS transistor. The reference clock receiver 301 also includes second common mode setting transistor 472 having a gate and a drain coupled to the first node 403 and a source coupled to ground. Therefore, the second common mode setting transistor 472 is diode-connected. The second common mode setting transistor 472 is a NMOS transistor. The common mode of the first node 403 is determined by the common mode setting transistors 471 and 472. The common mode setting transistors 471 and 472 are of equal strength if the target trip point is $V_{DD}/2$. The term "strength", as used herein, includes drive current. By "equal strength", as used herein, it is meant that the transistors have an equal drive current under same conditions. The integrated circuit 202 is designed and fabricated so that the common mode setting transistors 471 and 472 and the state-dependent resistive transistors 461 and 462 track the strength of the inverter transistors 441 and 442, respectively. The first common mode setting transistor 471 and the first state-dependent resistive transistor 461 track the strength of the first inverter transistor 441. The first common mode setting transistor 471 and the first state-dependent resistive transistor 461 are a scaled size of the first inverter transistor 441. The second common mode setting transistor 472 and the second state-dependent resistive transistor 462 track the strength of the second inverter transistor 442. By "track" as used herein, it is meant that the strength of two or more transistors change by a same amount and in a same direction, i.e., become stronger or weaker, at a same time, in response to changing conditions such as fabrication process variations, environmental and/or operating temperature changes, and supply voltage changes. The operation of the common mode setting transistors 471 and 472 are explained more fully hereinbelow.

In one embodiment, the first common mode setting transistor 471 is one-third the strength of the first inverter transistor 441, and the first state-dependent resistive transistor 461 is half the strength of the first common mode setting transistor 471. In such an embodiment, the second common mode setting transistor 472 is one-third the strength of the second inverter transistor 442, and the second state-dependent resistive transistor 462 is half the strength of the second common mode setting transistor 472. In another embodiment, common mode setting transistors 471 and 472 have the same strength as the inverter transistors 441 and 442. In still another embodiment, the strength of the state-dependent resistive transistors 461 and 462 is approximately 80% the strength of the common mode setting transistors 471 and 472. The actual relative strengths of these transistors are a design choice between noise margin and sensitivity.

The reference clock signal generator 204 and the power supply (not shown) that provides $V_{DD}$ to the reference clock receiver 301 may not start in unison. In other words, the reference clock signal 206 may be present at the input node 402 of the reference clock receiver 301 prior to its power supply reaching the voltage level of $V_{DD}$. The input node 402 is the first internal node of the integrated circuit 202. If the reference clock signal 206 is applied to the input node 402 of the reference clock receiver 301 before the reference clock receiver turns on, the reference clock signal 206 could cause permanent damage to the reference clock receiver. When $V_{DD}$ is powering up, the voltage level of $V_{DD}$ is temporarily at or near 0V, and the programmable transistors 411, 412 and 413 may not turn on, notwithstanding the presence of one or more receiver select signals 415, 416 and 417 that are intended to turn on the programmable transistors. Also, when $V_{DD}$ is powering up, a correct receiver select signal may not pass to the gates of the programmable transistors 411, 412 and 413. In either case, when $V_{DD}$ is powering up, the AC voltage divider may not set to a correct divider ratio. Therefore, gates of the inverter transistors 441 and 442 and the gates of the state-dependent resistive transistor 461 and 462 may experience a higher than normal voltage that may damage a transistor. To protect the inverter transistors 441 and 442 and the state-dependent resistive transistor 461 and 462 during power up, protection transistors 481, 482 and 483 are added. The protection transistors 481, 482 and 483 are PMOS transistors. The protection transistors 481, 482 and 483 protect the reference clock receiver 301 during power up. The gates of the protection transistors 481, 482 and 483 are connected to $V_{DD}$. The drains of the protection transistors 481, 482 and 483 are connected to ground. The sources of the protection transistors 481, 482 and 483 are connected to the drains of the programmable transistors 411, 412 and 413, respectively. When $V_{DD}$ is low, the protection transistors 481, 482 and 483 are turned on and they set the AC voltage divider to a maximum divider ratio to protect the inverter transistors 441 and 442 and the state-dependent resistive transistor 461 and 462. In other words, whenever $V_{DD}$ is not applied, such as at power-up, the protection transistors turn on, and thereby drive the lowermost (as viewed in FIG. 4) terminal of each capacitor 421, 422 and 423 to ground. By this action, the protection transistors 481, 482 and 483 ensure that, if any reference clock signal 206 is applied during power-up, the voltage of the reference clock signal is lowered to a minimum possible voltage. Therefore, for example, a 3.3V peak-to-peak reference clock signal (from a 3.3V voltage domain reference clock generator 204) will not be coupled to the one-volt transistors of the reference clock receiver 301. In summary, the purpose of the left portion of the reference clock receiver 301 is to produce a 1V peak-to-peak modified signal at the input to the inverter 440.

The trip point of the inverter 440 is nominally 0.5V. However, the trip point of the inverter 440 is a voltage that is dependent upon the ratio of the strength of the first inverter transistor 441 to the strength of the second inverter transistor 442. If the second inverter transistor 442 is stronger than the first inverter transistor 441, the trip point of the inverter 440 moves lower; for example, it may move from 0.5V to 0.4V. On the other hand, if the second inverter transistor 442 is weaker than the first inverter transistor 441, the trip point of the inverter 440 moves higher; for example, it may move from 0.5V to 0.6V. The inverter transistors 441 and 442 also have sensitivity to fabrication process and operating temperature. Because of variations in the strengths of the inverter transistors 441 and 442 caused by fabrication process and/or operating temperature, the trip point of the inverter 440 can vary, typically, from approximately 0.65V to approximately 0.35V.

It is necessary that the DC voltage at the first node 403 be at a level that allows the modified signal at the input of the inverter 440 to be sensed by the inverter, and thereby switch the inverter appropriately. Advantageously, with the reference clock receiver 301, the DC voltage at the first node 403 is at a level that does allows the modified signal at the input of the inverter 440 to be sensed by the inverter, causing the inverter to switch at the proper instant, thereby not adversely affecting the duty cycle of the clock out signal 208.

Because the external reference clock generator 204 may not pass a proper common mode value to the first node 403 of the reference clock receiver 301, the reference clock receiver uses the common mode setting transistors 471 and 472 to set a proper common mode. The common mode of the reference clock signal 206 is set by the common mode setting transistors 471 and 472 internally to the reference clock receiver 301 and within the integrated circuit 202 only. Because the common mode can be considered a DC value, the common mode setting transistors 471 and 472 do not affect the common mode of the reference clock signal 206 outside of the integrated circuit 202 due to the presence of the input capacitor 406.

Both of the common mode setting transistors 471 and 472 are conducting when the reference clock receiver 301 is operating. When the common mode setting transistors 471 and 472 are of equal strength, their presence in the circuit, and the fact that they are always on, should not affect the DC voltage level of the first node 403. Advantageously, the common mode setting transistors 471 and 472 track the strength and the $V_{DD}$ variation of the inverter transistors 441 and 442 because they share most of the characteristics of the inverter transistors. The common mode setting transistors 471 and 472 are arranged in a PMOS/NMOS diode-connected structure. By properly selecting the type and size of the common mode setting transistors 471 and 472, the common mode of the first node 403 tracks the trip point of the inverter 440, regardless of process, voltage and temperature conditions. For example, when the first inverter transistor 441 is weaker than the second inverter transistor 442, the trip point of the inverter 440 goes up, and the common mode of the first node 403 also goes up proportionally. When the second inverter transistor 442 is weaker than the first inverter transistor 441, the trip point of the inverter 440 goes down, and the common mode of the first node 403 also goes down proportionally. This feature is important for a clock receiver that receives a single-ended clock signal, such as the reference clock receiver 301, because this feature extends the working range of the clock receiver and minimizes duty cycle distortion.

When the external reference clock signal 206 switches from low to high or from high to low, the modified signal at the first node 403 follows. As soon as a voltage at the first node 403 passes a trip point of the inverter 440, the output 439 of the inverter switches state. A change in the state of the output 439 of the inverter 440 triggers the state-dependent resistive transistors 461 and 462 to turn on/off appropriately. The state-dependent resistive transistors 461 and 462 maintain the state of the first node 403 to one of a high and a low state so that the first node is ready for a next transition.

The common mode setting transistors 471 and 472 work in conjunction with the state-dependent resistive transistors 461 and 462. When the signal at the output of the inverter 440 goes from low to high, the first state-dependent resistive transistor 461 turns on. When the first state-dependent resistive transistor 461 is on, it teams with the first common mode setting transistor 471 to form a DC voltage divider with the second common mode setting transistor 472. In other words, the first common mode setting transistor 471 and the first state-dependent resistive transistor 461 are both on (which are trying to pull the common mode value higher), and they "fight" the second common mode setting transistor 472 that is also on (which is trying to pull the common mode value lower).

When the signal at the output of the inverter 440 goes from high to low, the second state-dependent resistive transistor 462 turns on. When the second state-dependent resistive transistor 462 is on, it teams with the second common mode setting transistor 472 to form a DC voltage divider with the first common mode setting transistor 471. In other words, the second common mode setting transistor 472 and the second state-dependent resistive transistor 462 are both on (which are trying to pull the common mode value lower), and they "fight" the first common mode setting transistor 471 that is also on (which is trying to pull the common mode value higher).

In other words, the common mode setting transistors 471 and 472 together with one of the first and second state-dependent resistive transistors 461 and 462 (depending on the state of the output of the inverter 440), form a DC voltage divider circuit, such that the DC voltage at first node 403 advantageously never goes all the way to $V_{DD}$ or all the way to 0V. The DC voltage at first node 403 goes up to a high intermediate voltage (rather than all the way to $V_{DD}$ as with the prior art) or goes down to a low intermediate voltage (rather than all the way to 0V as with the prior art). The strength of the common mode setting transistors 471 and 472 relative to the second state-dependent resistive transistors 461 and 462 and the inverter transistors 441 and 442, are selected to determine values for the high intermediate voltage and the low intermediate voltage. The values for the high intermediate voltage and the low intermediate voltage will determine whether the inverter 440 is more tolerant or more sensitive to noise. Typically, the high intermediate voltage selected to be 75% of $V_{DD}$, and the low intermediate voltage is selected to be 25% of $V_{DD}$, which can be considered an equal compromise between tolerance and sensitivity to noise. An advantage of "parking" the DC voltage level at the input to the inverter 440 at one of 0.75V and 0.25V is that a voltage swing at the first node 403 of only 0.25V is enough to trip the inverter. Because the prior art state-dependent resistive transistors 161 and 162 "park" the DC voltage level at the input to the prior art inverter 140 at one of 1V (i.e., $V_{DD}$) and 0V (i.e., ground), a larger voltage swing at the first node 103 of 0.5V is disadvantageously required to trip the prior art inverter.

Unlike a DC voltage divider that uses resistors, which divides by a fixed factor, the AC voltage divider formed by the common mode setting transistors 471 and 472 and one of the state-dependent resistive transistors 461 and 462 is a "modulated" DC voltage divider that can change the factor by which it divides. Such "modulation" depends upon the trip point of the inverter 440, which, in turns, depends upon the strength of inverter transistor 441 relative to inverter transistor 442.

Without the state-dependent resistive transistors 461 and 462, the DC voltage at the input of the inverter 440 would be a voltage that is dependent upon the ratio of the strength of the first common mode setting transistor 471 to the strength of the second common mode setting transistor 472, regardless of the state of the output of the inverter.

Without the common mode setting transistors 471 and 472, the DC voltage at the input of the inverter 440 would be a voltage that is one of $V_{DD}$ and zero, depending upon the state of the output of the inverter.

When both the two state-dependent resistive transistors 461 and 462 and the two common mode setting transistors 471 and 472 are present, as in the reference clock receiver 301, the DC voltage at the input of the inverter is either 1) a voltage, dependent upon the state at the output of the inverter, that is higher voltage than the common mode of the external reference clock (after being divided by the AC voltage divider), but less than $V_{DD}$; or 2) a voltage, dependent upon the state at the output of the inverter, that is lower voltage than the common mode of the external reference clock (after being divided by the AC voltage divider), but greater than zero.

Although the first common mode setting transistor 471 is not identical in all respects to the first inverter transistor 441, it shares most of its characteristics and is of the same type, same channel length, same channel width, same gate oxide thickness and same voltage threshold, and they are proximate to each other in the layout of the circuit on the substrate of the integrated circuit 202. Although the second common mode setting transistor 472 is not identical in all respects to the second inverter transistor 442, it shares most of its characteristics and is of the same type, same channel length, same channel width, same gate oxide thickness and same voltage threshold, and they are proximate to each other in the layout of the circuit on the substrate of the integrated circuit 202. In one embodiment, the integrated circuit 202 is designed such that the common mode setting transistors 471 and 472 and the inverter transistors 441 and 442, are as near to each other, respectively, in the layout as is feasible. By "type" as used herein, it is meant a same semiconductor material, a same structure (e.g., BJT, JFET, MOSFET, IGBT, etc.) and a same polarity. Therefore, any changes in the characteristics of the inverter transistors 441 and 442, such as $V_{DD}$, fabrication process or operating temperature, are mimicked by the common mode setting transistors 471 and 472, respectively. And, therefore, any changes in the characteristics of the inverter transistors 441 and 442, such as $V_{DD}$, fabrication process or operating temperature, are mimicked by the state-dependent resistive transistors 461 and 462, respectively. If the second inverter transistor 442 is or becomes proportionally stronger than the first inverter transistor 441, the trip point of the inverter 440 moves lower, for example, from 0.5V to 0.4V. However, in such a case, the second common mode setting transistor 472 and the second state-dependent resistive transistor 462 would also become stronger (because they mimic the second inverter transistor 442). When the second common mode setting transistor 472 is stronger than the first common mode setting transistor 471 and when the second state-dependent transistor 462 is stronger than the first state-dependent resistive transistor 461, the common mode lowered, which advantageously compensates for the trip point of the inverter 440 going lower.

The strength of the state-dependent resistive transistors 461 and 462 relative to the common mode setting transistors 471 and 472, respectively, determines how much the common mode at the first node 403 moves from the nominal 0.5V in response to the trip point of the inverter moving. The strength of the common mode setting transistors 471 and 472 relative to the second state-dependent resistive transistors 461 and 462, respectively, and the inverter transistors 441 and 442, respectively, are selected so that the common mode of the reference clock receiver 301, i.e., the DC voltage level at the input to the inverter 440, changes by a same number of volts and in a same direction as the number of volts that the trip point of the inverter changes, in the event that the trip point of the inverter does change.

Figure 5:
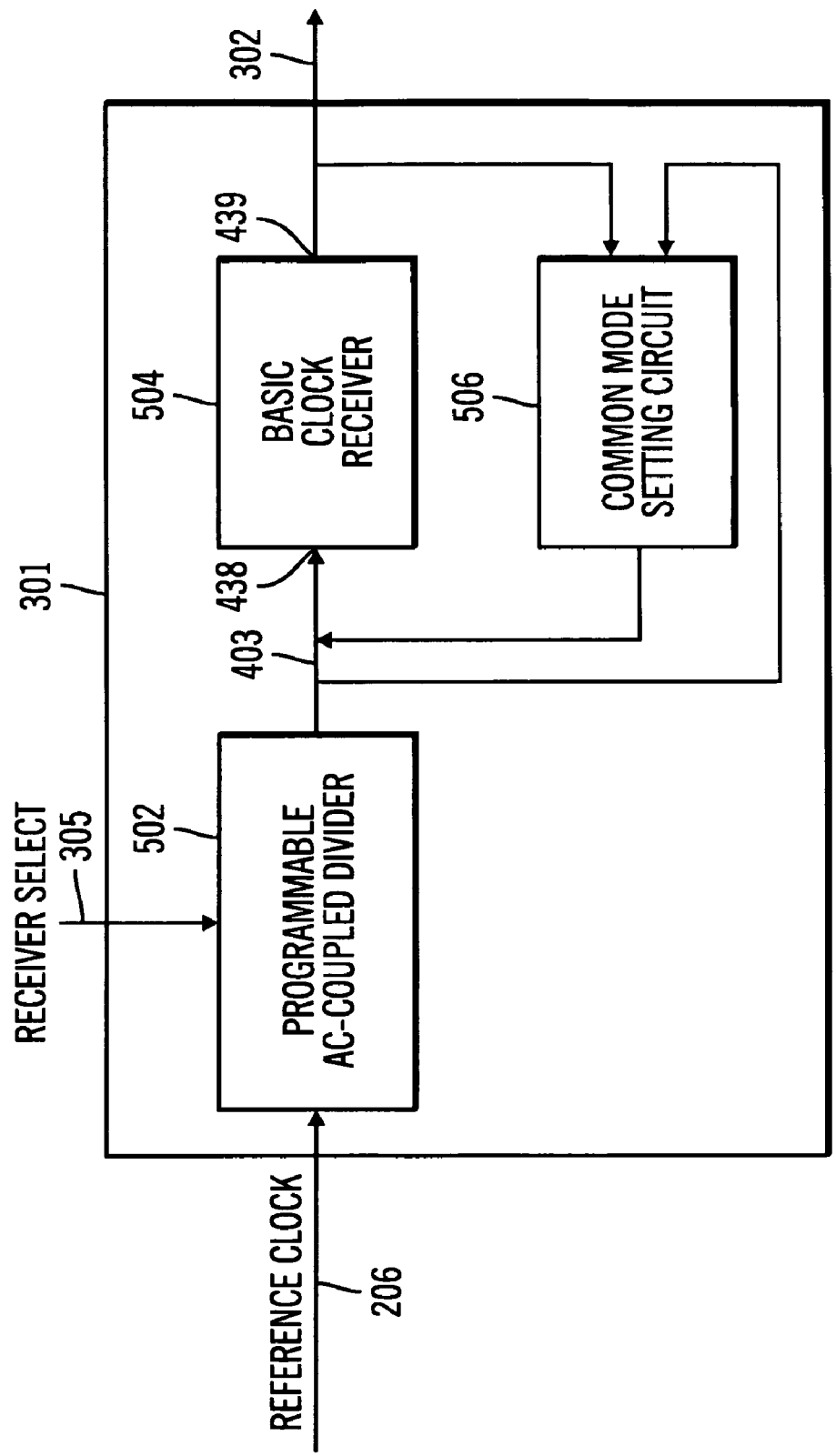
FIG. 5 is a simplified block diagram of a reference clock receiver, such as the reference clock receiver shown in FIG. 3.

FIG. 5 is a simplified block diagram of the reference clock receiver 301. The reference clock receiver 301 can be generalized into a programmable AC-coupled divider 502, a basic clock receiver 504 and a common mode setting circuit 506. The programmable AC-coupled divider 502 receives the reference clock signal 206 and the receiver select signal 305. The programmable AC-coupled divider 502 outputs a signal to node 403 that is coupled to an input of the basic clock receiver 504. The programmable AC-coupled divider 502 reduces the VIH of the reference clock signal 206 based on a value of the receiver select signal 305, and outputs a modified signal, representative of the reference clock signal 206, to the basic clock receiver 504. In one embodiment, the programmable AC-coupled divider 502 includes programmable transistors 411, 412 and 413; protection transistors 481, 482 and 483; protection capacitors 421, 422 and 423; and input capacitor 406. The basic clock receiver 504 includes an inverter, and the basic clock receiver receives the modified signal from the programmable AC-coupled divider 502 and outputs a logical inverse of the signal. In one embodiment, the basic clock receiver 504 includes inverter transistors 441 and 442. Using an output of the basic clock receiver 504 and an input to the basic clock receiver, the common mode setting circuit 506 sets the common mode of the modified signal accordingly. In one embodiment, the common mode setting circuit 506 includes state-dependent resistive transistors 461 and 462, and common mode setting transistors 471 and 472. The reference clock receiver 301 sets the common mode of the input signal to the basic clock receiver 504 to a voltage that maximizes the range of VIH swings of the reference clock signal 206 that reference clock receiver can successfully receive.

Figure 6:
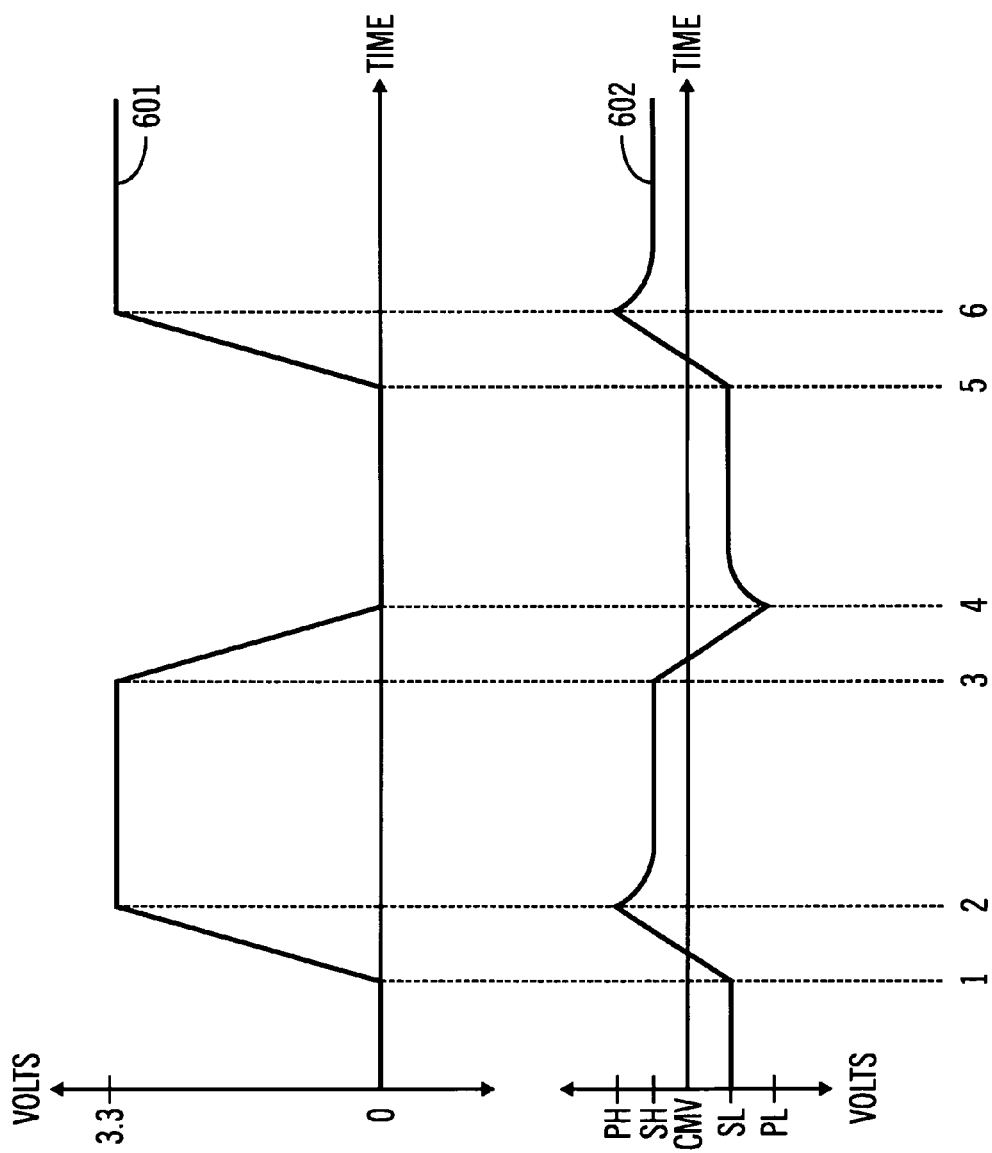
FIG. 6 is a chart showing an example of a reference clock signal that may be received by the reference clock receiver and a signal within the reference clock receiver responsive thereto.

FIG. 6 is a chart showing an example waveform 601 of the reference clock signal 206 that may be received by the reference clock receiver 301, and a waveform 602 of the modified signal at the first node 403, which is responsive to the reference clock signal and representative of the frequency of the reference clock signal. The example waveform 601 of the reference clock signal 206 from the reference clock generator 204 has a VIL of 0V and a VIH of 3.3V. The reference clock signal 206 has a typical slew rate of approximately 1-4 V/nsec. For a reference clock signal 206 that has a VIH of 3.3V, it takes 0.8 nsec to 3.3 nsec for a full rail swing, depending on the frequency of the reference clock signal. The waveform 602 of the modified signal at the first node 403 shows that, from time "1" to time "2", the first node 403 goes from low to high. The waveform 602 shows that, from time "2" to time "3", the common mode setting circuit 506 maintains the DC voltage at the first node 403 at a stable high (SH) intermediate voltage after having been momentarily at a peak high (PH) voltage. In one embodiment, the PH voltage is approximately 1.1V and the SH intermediate voltage is approximately 0.75V. The waveform 602 shows that, from time "3" to time "4", first node 403 goes from high to low. The waveform 602 shows that, from time "4" to time "5", the common mode setting circuit 506 maintains the DC voltage at the first node 403 at a stable low (SL) intermediate voltage after having been momentarily at a peak low (PL) voltage. In one embodiment, the PL voltage is approximately −0.1V and the SL intermediate voltage is approximately +0.25V. From time "5" to time "6", the waveform 602 repeats, and the first node 403 goes from low to high. The common mode for the first node 403 is the average of the voltage between time "2" and time "3" and the voltage between time "4" and time "5". In one embodiment, the common mode value is 0.5V, i.e., the average of the SH voltage of 0.75V and the SL voltage of 0.25V. In FIG. 6, the common mode value (CMV) is shown as the horizontal axis of the graph of the waveform 602.

The common mode of the first node 403 tracks the trip point of the inverter 440 of the reference clock receiver 301, thus minimizing distortion of the duty cycle and extending a working range of the reference clock receiver toward working successfully with smaller voltage swings. When the common mode tracks the trip point, the duty cycle is preserved.

Advantageously, the reference clock receiver 301 can still function when the VIH of the reference clock generator within a 3.3V domain, goes down to 1.5V.

With the reference clock receiver 301, the common mode remains at the trip point of the inverter 440, so as to advantageously maintain the greatest noise margin. The reference clock receiver 301 improves upon the size of the acceptable amplitude voltage window, i.e., the range of input voltage swing levels within a voltage domain, presented at the input to the reference clock receiver.

The reference clock receiver 301 resolves issues seen in the prior art by: 1) adding protection transistors 481, 482 and 483 for power-up sequence protection, and 2) adding common mode setting transistors 471 and 472 to make the common mode of the first node 403 track the trip point of the inverter 440 of the reference clock receiver 301.

In one embodiment, the reference clock receiver 301 is disposed on an integrated circuit fabricated using a complementary metal oxide semiconductor (CMOS) process. In one embodiment, the reference clock receiver 301 comprises transistors that have a maximum operating voltage of 1.0V. In another embodiment, the reference clock receiver 301 comprises transistors that have a maximum operating voltage of 1.5V. In one embodiment, the reference clock receiver 301 comprises thin-oxide transistors. In another embodiment, the reference clock receiver 301 comprises dual gate oxide (DGO) transistors.

Although the invention is described herein with reference to specific embodiments, various modifications and changes can be made without departing from the scope of the present invention as set forth in the claims below. For instance, although the exemplary embodiments show that the reference clock receiver 301 is disposed on an integrated circuit, the invention is equally usable when constructed entirely of components consisting of discrete devices. Although the exemplary embodiments show that the reference clock receiver 301 comprises FETs, some or all of the transistors of the reference clock receiver 301 can be bipolar junction transistors. Although, in one exemplary embodiment, the reference clock receiver 301 is disposed on an integrated circuit fabricated using CMOS technology, the reference clock receiver can also be disposed on an integrated circuit fabricated using other technologies.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A clock receiver, comprising:
   a programmable voltage divider having
      an input for receiving an input signal with a cycle with a frequency and a voltage swing, and
      an output for outputting a modified input signal that has a same frequency as the frequency of the input signal and that has a reduced voltage swing, the modified input signal having only an alternating current (AC) component because the input capacitor blocks any direct current (DC) component of the input signal;
   a basic receiver including an inverter with a trip point, the basic receiver, having
      an input coupled to the output of the programmable voltage divider, for receiving the modified input signal, and
      an output for outputting an output signal having a voltage representing a logic level opposite the logic level represented by the voltage of the modified input signal at the input of the basic receiver; and
   a common mode setting circuit having
      an input coupled to the input and to the output of the basic receiver, and
      an output coupled to the input of the basic receiver;
   wherein the common mode setting circuit comprises:
      a first common mode setting transistor having a source coupled to the first supply potential, having a gate and a drain coupled to the input of the basic receiver,
      a second common mode setting transistor having a source coupled to the second supply potential, having a gate and a drain coupled to the input of the basic receiver,
      a first state-dependent resistive transistor having a source coupled to the first supply potential, a gate coupled to the output of the basic receiver, and a drain coupled to the input of the basic receiver, wherein a size of the first state-dependent resistive transistor and a size of the first common mode setting transistor are such that the common mode setting circuit sets, during one half cycle, the DC voltage level at the input of the basic receiver to a value between the first supply potential and the trip point, and
      a second state-dependent resistive transistor having a source coupled to the second supply potential, a gate coupled to the output of the basic receiver, and a drain coupled to the input of the basic receiver, wherein a size of the second state-dependent resistive transistor and a size of the second common mode setting transistor are such that the common mode setting circuit sets, during another half cycle, the DC voltage level at the input of the inverter to another value between the trip point and the second supply potential.

2. The clock receiver of claim 1, wherein the signal is a single-ended clock signal.

3. The clock receiver of claim 1, wherein the programmable voltage divider comprises a plurality of protection capacitors that form, with the input capacitor, a programmable voltage divider for dividing the voltage swing of the received signal to produce the modified signal.

4. The clock receiver of claim 1, wherein the inverter of the basic receiver comprises:
   a first inverter transistor having a source coupled to a first supply potential, a gate coupled to the input of the inverter, and a drain coupled to the output of the inverter, wherein a strength of the first inverter transistor is three times the strength of the first common mode setting transistor,
   a second inverter transistor having a source coupled to a second supply potential, a gate coupled to the input of the inverter, and a drain coupled to the output of the inverter, wherein a strength of the second inverter transistor is three times the strength of the second common mode setting transistor,
   wherein the inverter has a trip point dependent upon strength of first inverter transistor relative to strength of second inverter transistor, and
   wherein the output of the inverter changes when a voltage at the input of the basic receiver reaches the trip point.

5. The clock receiver of claim 1, wherein the common mode setting circuit controls the value of the common mode at the input to the basic receiver such that the common mode at the input to the basic receiver changes by a same number of volts and in a same direction as the trip point of the inverter changes.

6. The receiver of claim 1, wherein the size of the first state-dependent resistive transistor is half the size of the first common mode setting transistor, and wherein the size of the second state-dependent resistive transistor is half the size of the second common mode setting transistor.

7. The clock receiver of claim 5, wherein, in an event a drive current of the first inverter transistor changes, a drive current of the first common mode setting transistor and a drive current of the first state-dependent resistive transistor change by a proportional number of milliamps and in a same direction as the change in the drive current of the first inverter transistor.

8. The clock receiver of claim 5, wherein, in an event a drive current of the first inverter transistor changes, a drive current of the first common mode setting transistor and a drive current of the first state-dependent resistive transistor change by a proportional number of milliamps and in a same direction as the change in the drive current of the second inverter transistor.

9. A clock receiver, comprising:
   an input for receiving a clock signal having a cycle with a voltage swing;
   an input capacitor coupled between the input and a first node, for coupling a modified clock signal to the first node, the modified clock signal having only an alternating current (AC) component because the input capacitor blocks any direct current (DC) component of the clock signal;
   an inverter, coupled to a first supply potential and to a second supply potential, having an input coupled to the first node, for receiving the modified clock signal, the inverter having an output, coupled to an output of the clock receiver, for outputting a voltage corresponding to an opposite logic level as the voltage at the input of the inverter, the inverter comprising first inverter transistor and second inverter transistor, the inverter having a trip point; and
   a common mode setting circuit having an input coupled to the input of the inverter and to the output of the inverter and an output coupled to the input of the inverter, wherein, for each half cycle of the modified clock signal, the common mode setting circuit sets and maintains a value for a DC voltage at the input of the inverter based, in part, on an AC voltage of the modified clock signal and, in part, on a DC voltage at the output of the inverter such that a DC voltage level at the input of the inverter allows a voltage swing of the modified clock signal to trip the inverter during each half cycle, wherein the common mode setting circuit comprises:
a first state-dependent resistive transistor having a source coupled to the first supply potential, a gate coupled to the output of the inverter, and a drain coupled to the first node,
a second state-dependent resistive transistor having a source coupled to the second supply potential, a gate coupled to the output of the inverter, and a drain coupled to the first node,
a first common mode setting transistor having a source coupled to the first supply potential, and having a gate and a drain coupled to the first node, wherein a size of the first common mode setting transistor is related to a size of the first inverter transistor and to a size of the first state-dependent resistive transistor, and
a second common mode setting transistor having a source coupled to the second supply potential, and having a gate and a drain coupled to the first node, wherein a size of the second common mode setting transistor is related to a size of the second inverter transistor and to a size of the second state-dependent resistive transistor.

10. The clock receiver of claim 9, wherein, for each half cycle of the clock signal, the first and second common mode setting transistors in conjunction with one of the first and second state-dependent resistive transistors conducting and the other not conducting, depending on the output of the inverter, set a common mode for the modified signal.

11. The clock receiver of claim 9, wherein the inverter comprises:
a first inverter transistor having a source coupled to the first supply potential, a gate coupled to the input of the inverter, and a drain coupled to the output of the inverter, wherein the first inverter transistor and the first common mode setting transistor are of a same type, same channel length, same channel width, same gate oxide thickness and same voltage threshold,
a second inverter transistor having a source coupled to the second supply potential, a gate coupled to the input of the inverter, and a drain coupled to the output of the inverter, wherein the second inverter transistor and the second common mode setting transistor are of a same type, same channel length, same channel width, same gate oxide thickness and same voltage threshold,
wherein the inverter has a trip point dependent upon strength of first inverter transistor relative to strength of second inverter transistor, and
wherein the output of the inverter changes when a voltage of a signal at the input of the inverter reaches a trip point.

12. The clock receiver of claim 11, wherein the common mode of the modified signal tracks the trip point of the inverter.

13. The clock receiver of claim 12, wherein the first common mode setting transistor and the first state-dependent resistive transistor track the strength of the first inverter transistor.

14. The clock receiver of claim 12, wherein the second common mode setting transistor and the second state-dependent resistive transistor track the strength of the second inverter transistor.

15. An integrated circuit, comprising:
a clock receiver having an input and an output, the clock receiver including:
an inverter having an input AC coupled to the input of the clock receiver, for receiving a clock signal, the clock signal having a cycle with a frequency, and an output coupled to the output of the clock receiver, the inverter comprising:
a first inverter transistor having a source coupled to a first supply potential, a gate coupled to the input of the inverter, and a drain coupled to the output of the inverter,
a second inverter transistor having a source coupled to a second supply potential, a gate coupled to the input of the inverter, and a drain coupled to the output of the inverter,
wherein the inverter has a trip point of first supply potential plus second supply potential divided by two, and
wherein the output of the inverter changes when a voltage of a signal at the input of the inverter reaches the trip point; and
a common mode setting circuit having an input coupled to the input of the inverter and to the output of the inverter and an output coupled to the input of the inverter, wherein, at each half cycle of the clock signal, the common mode setting circuit sets and maintains a present value for a DC voltage at the input of the inverter based, in part, on a present AC voltage of the clock signal and, in part, on a present DC voltage at the output of the inverter that was set by a previous AC voltage of the clock signal during a previous half cycle of the clock signal, such that a DC voltage level at the input of the inverter allows the clock signal to reach a voltage level during each half cycle sufficient to trip the inverter, wherein the common mode setting circuit comprises:
a first common mode setting transistor having a source coupled to the first supply potential, having a gate and a drain coupled to the first node,
a second common mode setting transistor having a source coupled to a second supply potential, having a gate and a drain coupled to the first node,
a first state-dependent resistive transistor having a source coupled to the first supply potential, a gate coupled to the output of the inverter, and a drain coupled to the first node, wherein a size of the first state-dependent resistive transistor and a size of the first common mode setting transistor are such that the common mode setting circuit sets, during one half cycle, the DC voltage level at the input of the inverter to a value between the first supply potential and the trip point, and
a second state-dependent resistive transistor having a source coupled to the second supply potential, a gate coupled to the output of the inverter, and a drain coupled to the first node, wherein a size of the first state-dependent resistive transistor and a size of the first common mode setting transistor are such that the common mode setting circuit sets, during another half cycle, the DC voltage level at the input of the inverter to another value between the trip point and the second supply potential.

16. The integrated circuit of claim 15, wherein the first and second common mode setting transistors with the first and second state-dependent resistive transistors, set a common mode for the clock signal such that the common mode tracks the trip point of the inverter.

17. The integrated circuit of claim 15, wherein the clock signal is from an external clock signal generator located off the integrated circuit, the clock signal having a voltage swing, and wherein the clock receiver further comprises a divider circuit for dividing the voltage swing of the clock signal to produce a modified signal having a same frequency as the clock signal and having a smaller voltage swing.

18. The integrated circuit of claim 17, wherein the clock receiver comprises transistors that have a maximum operating voltage of less than or equal to 1.5V, and wherein the clock signal has a voltage swing of greater than or equal to 1.8V.

19. The integrated circuit of claim 15, wherein the first common mode setting transistor, the first state-dependent resistive transistor, and the first inverter transistor are in proximity to each other in a layout of the circuit on a substrate of the integrated circuit.

20. The integrated circuit of claim 19, wherein the first common mode setting transistor, the first state-dependent resistive transistor, and the first inverter transistor share characteristics of: type, gate oxide thickness, and channel length.

* * * * *